United States Patent
Obermaier et al.

[11] Patent Number: 5,966,293
[45] Date of Patent: Oct. 12, 1999

[54] MINIMAL LENGTH COMPUTER BACKPLANE

[75] Inventors: Hannsjorg Obermaier, Los Gatos; Keunmyung Lee, Palo Alto, both of Calif.

[73] Assignee: Hewlett-Packard Company, Palo Alto, Calif.

[21] Appl. No.: 08/990,635

[22] Filed: Dec. 15, 1997

[51] Int. Cl.⁶ ........................................ H05K 7/10
[52] U.S. Cl. .................. 361/735; 361/760–764; 361/785; 361/683; 361/780; 361/803; 174/260; 174/117 F; 174/117 FF; 333/124; 333/125; 333/128; 333/161; 439/61; 439/62; 439/65; 439/67; 257/734; 257/750; 257/773; 257/774
[58] Field of Search .................... 361/735, 760–764, 361/785, 744, 683, 733, 780, 803; 174/260, 117 F, 117 FF; 333/124, 125, 128, 161; 395/800, 200.3; 439/61, 62, 65, 67; 257/734, 750, 773, 774

[56] References Cited

U.S. PATENT DOCUMENTS

| | | | |
|---|---|---|---|
| 4,700,274 | 10/1987 | Laut | 361/729 |
| 5,069,628 | 12/1991 | Crumly | 439/67 |
| 5,119,273 | 6/1992 | Corda | 361/788 |
| 5,122,691 | 6/1992 | Balakrishnan | 307/475 |
| 5,210,682 | 5/1993 | Takashima | 361/744 |
| 5,227,957 | 7/1993 | Deters | 361/686 |
| 5,603,044 | 2/1997 | Annapareddy et al. | 395/800 |
| 5,650,757 | 7/1997 | Barber | 333/128 |

Primary Examiner—Leo P. Picard
Assistant Examiner—David Foster
Attorney, Agent, or Firm—Brian R. Short

[57] ABSTRACT

An electrical interconnection structure. The electrical interconnection structure includes a mother board substrate having a plurality of layers. At least one layer includes a signal path having a characteristic impedance of $Z_O$ and a conductive ground plane. A signal via passes through each layer of the mother board substrate. The signal via electrically is connected to the signal path. A ground via passes through each layer of the mother board substrate. The ground via is electrically connected to the conductive ground plane. The electrical interconnection structure further includes a plurality of flex circuits. Each flex circuit includes a flex signal path having a characteristic impedance of $Z_O$ and a flex ground plane. Each flex signal path is electrically connected to the signal via and each flex ground plane is electrically connected to the ground via. The connections between the flex signal path and the signal via, and between the flex ground plane and the ground via can be permanent or separable.

12 Claims, 11 Drawing Sheets

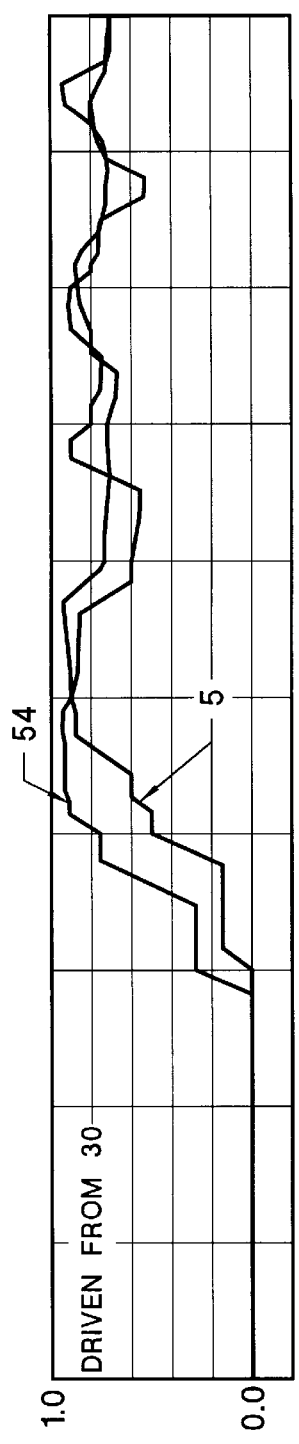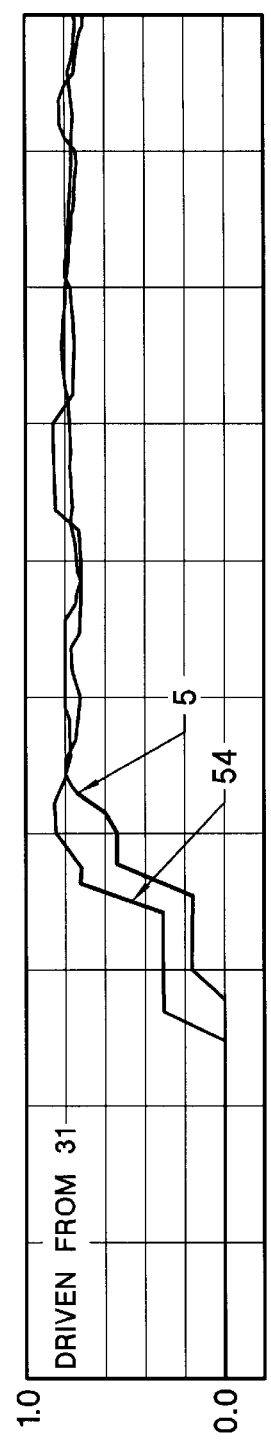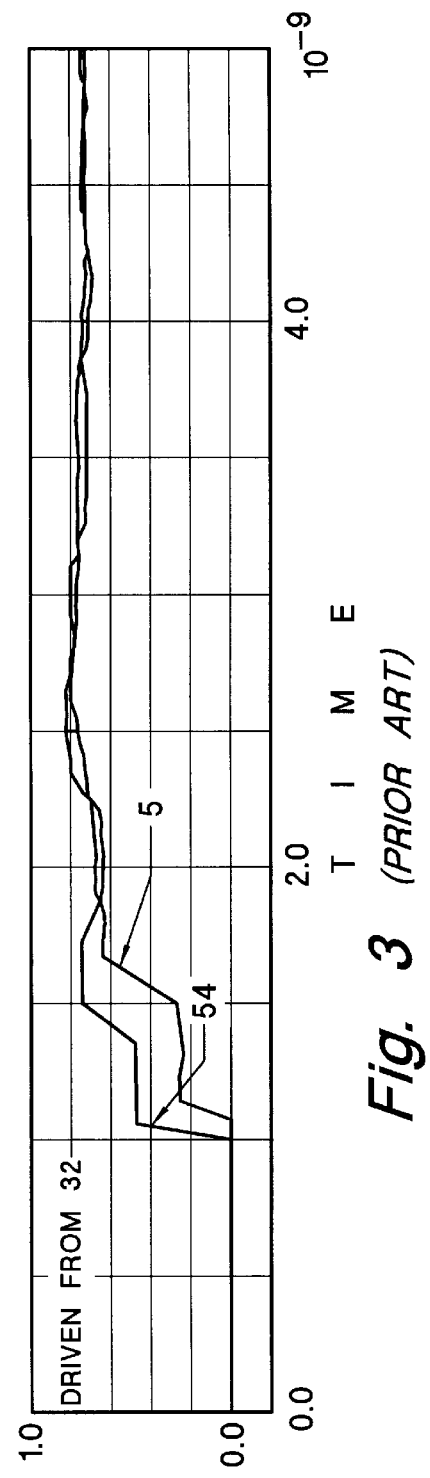
Fig. 3 (PRIOR ART)

MINIMAL LENGTH COMPUTER BACKPLANE

FIELD OF INVENTION

This invention relates generally to a high-speed computer interface bus. In particular, it relates to a computer interface bus in which the length of the bus is minimized.

BACKGROUND

High performance computers generally have an interconnect backplane. The interconnect backplane provides an interconnection path between various components of the computer. Typically, about 5–6 components are interconnected. The components may be microprocessors, memory or other computer associated circuitry.

FIG. 1 shows a computer interconnect backplane 10. The interconnect backplane 10 is typically a printed circuit board. The interconnect backplane 10 has a bus 12 which interconnects components 14, 15, 16, 17, 18, 19 of the computer. Each of the components can include integrated circuits (ICs) such as an IC 20 attached to component 14. Typically, a matched impedance 22 is attached to both ends of the bus 12.

The speed of the microprocessors and memory connected to the interconnection backplane is constantly increasing. As the speed of the circuitry increases, parasitic capacitance and impedance mismatches on the interconnection bus 12 begin to affect the integrity of the signals traveling on the bus from one component to another. As a result, the technology used to implement the interconnection backplane must evolve as the components connected to the backplane operate at faster speeds.

Presently, computer interconnection backplanes are implemented as suggested by the circuit schematic shown in FIG. 2. The bus is implemented with bus transmission lines 24, 25, 26, 27, 28 that interconnect the components attached to the bus at a series of node interconnect points 0, 1, 2, 3, 4, 5. The bus transmission lines can be implemented with microstrip or stripline, and have a characteristic impedance of $Z_O$. Termination impedance loads 36, 37 are located at the two end nodes 0, 5. The components 30, 31, 32, 33, 34, 35 connected to the nodes are devices that are either in a driver mode or in a listener mode. Only a single one of the components 30, 31, 32, 33, 34, 35 may be in driver mode at a time. If a component is in driver mode then that component determines the voltage level of the interconnection bus. The driver component can be in one of two states. The driver component sets the voltage level of the bus to one of two voltage levels in which a voltage level corresponds to each state. If a component is in listener mode then that component is receiving the voltage level of the bus. The components 30, 31, 32, 33, 34, 35 in FIG. 2 are represented by input/output (I/O) devices. A component 32 is the driver device and has a low output impedance of typically less than 10 ohms. All of the other components (I/Os) 30, 31, 33, 34, 35 are depicted as listener devices and have high input impedances.

In operation, the interconnection bus operates as follows. When the driver component 32 transitions from one of two states to the other, a rising or falling edge propagates down the bus transmission lines 24, 25, 26, 27, 28 as the voltage level on the bus switches from one level to another. Each listener component 30, 31, 33, 34, 35 receives the new voltage level corresponding to the new state of the driver component as the rising or falling edge reaches the listener component. The rising or falling edge propagates to the end of the bus and is terminated because of the presence of the termination impedance loads 36, 37. The termination impedance loads 36, 37 are matched to the characteristic impedance of the bus transmission lines so that the rising or falling edges are not reflected upon reaching the termination impedance loads 36, 37.

Typically, the components are connected to the nodes of the bus through conductive component connection transmission line sections. The component connection transmission line sections may have a characteristic impedance that is the same as the characteristic impedance of the bus transmission lines. Therefore, impedance mismatches can occur at each node where the component connection transmission line sections make electrical contact with the bus transmission line sections. As the frequency of the transitions from the driver component increases the risetime of transition edges decreases and impedance mismatches have a greater effect on the integrity of the voltage transitions received by the listener components. Component connection transmission line sections that are tolerable with transitions of 1 nanosecond may be intolerable in faster systems. The component connection transmission line sections become "visible" when the electrical length of the component connection transmission line section is on the order of the risetime of the transition edge.

The circuit schematic of FIG. 2 represents a typical backplane bus with component connection transmission line sections 41, 42, 43, 44 connecting components 31, 32, 33, 34 to the bus at nodes 51, 52, 53, 54, and bus transmission lines 24, 28 connecting components 30, 35 to the bus at nodes 0 and 5. The arrows on FIG. 2 depict where the impedance mismatches within the backplane interconnection bus are located. At each impedance mismatch, a reflection will occur if a high speed rising or falling voltage transitional edge propagates into the impedance mismatch. The mismatches are located so that a single edge may reflect back and forth between impedance mismatches causing ringing. The ringing will cause the interconnection bus to take a longer period of time to reach a static voltage level.

FIG. 3 shows the results of a transient simulation of the circuit schematic of FIG. 2 in which $Z_O$ is 50 ohms, the driver has an output impedance of 10 ohms and an open circuit output voltage of 1 volt, each bus transmission line 24, 25, 26, 27, 28 is 300 picoseconds long, each component connection transmission line sections 41, 42, 43, 44 is 200 picoseconds long, and the edge risetime is 100 picoseconds. Traces 3A, 3B and 3C show time lines of the voltage levels received at nodes 54 and 5 when the driver component is components 30, 31, 32.

Trace 3A shows the voltage levels received at nodes 54 and 5 when the driver component is component 30. The two waveforms depict the delay as the voltage transition of the driver travels down the interconnection bus. The two waveforms also show the distortion of the voltage transition due to the additive and subtractive components of the reflected components of the voltage transition as the transition encounters impedance mismatches on the interconnection bus. Trace 3B shows the voltage levels received at nodes 54 and 5 when the driver component is component 31. Trace 3C shows the voltage levels received at nodes 54 and 5 when the driver component is component 32.

Traces 3A, 3B and 3C show that the voltage levels at all nodes and connection points on the interconnection bus take longer to reach a static state when the driver component operates with a rise or fall time equal to or less than the electrical length of the bus transmission line sections 24, 25, 26, 27, 28 and the component connection transmission line sections 41, 42, 43, 44. The distortion to voltage transitions on the interconnection bus due to the impedance mismatches on the interconnection bus reduces the rate at which the voltage transitions can occur since each voltage transition must be substantially settled at a receiving node before subsequent transitions arrive in order to avoid bit errors. The rate limitation reduces the frequency at which signals on the interconnection bus can be usefully coupled between components connected to the interconnection bus.

The operating frequencies of the components connected to computer interconnection backplanes are constantly increasing. Therefore, new configurations and new methods of fabricating computer interconnection backplanes must be developed. It is desirable to have computer backplane interconnection bus which minimizes impedance mismatches. The computer backplane interconnection bus would allow the addition of input/output connections to the interconnection bus without introducing impedance mismatches.

SUMMARY OF THE INVENTION

The present invention provides a computer backplane interconnection bus which minimizes impedance mismatches. The computer backplane interconnection bus provide many input/output connections to the interconnection bus without introducing an impedance mismatch for each input/output interconnection.

A first embodiment of this invention includes an electrical interconnection structure. The electrical interconnection structure includes a mother board substrate having a plurality of layers. At least one layer includes a signal path having a characteristic impedance of $Z_O$ and at least one of the layers includes a conductive ground plane. A signal via passes through each layer of the mother board substrate. The signal via electrically is connected to the signal path. A ground via passes through each layer of the mother board substrate. The ground via is electrically connected to the conductive ground plane. The electrical interconnection structure further includes a plurality of flex circuits. Each flex circuit includes a flex signal path having a characteristic impedance of $Z_O$ and a flex ground plane. Each flex circuit is received by a different layer of the mother board substrate. Each flex signal path is permanently electrically connected to the signal via and each flex ground plane is permanently electrically connected to the ground via.

Another embodiment of the invention is an electrical interconnection structure. The electrical interconnection structure of this embodiment includes a mother board substrate having a plurality of layers. At least one layer includes a signal path having a characteristic impedance of $Z_O$ and a conductive ground plane. A signal via passes through each layer of the mother board substrate. The signal via is electrically connected to the signal path. A ground via passes through each layer of the mother board substrate. The ground via is electrically connected to the conductive ground plane. The electrical interconnection structure further includes a plurality of flex circuits. Each flex circuit includes a flex signal path having a characteristic impedance of $Z_O$ and a flex ground path. The flex signal path is separably electrically connected to the signal via and the flex ground path is separably electrically connected to the ground via.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 3 shows the results of a transient simulation of the circuit schematic of FIG. 2.

DETAILED DESCRIPTION

Figure 1:
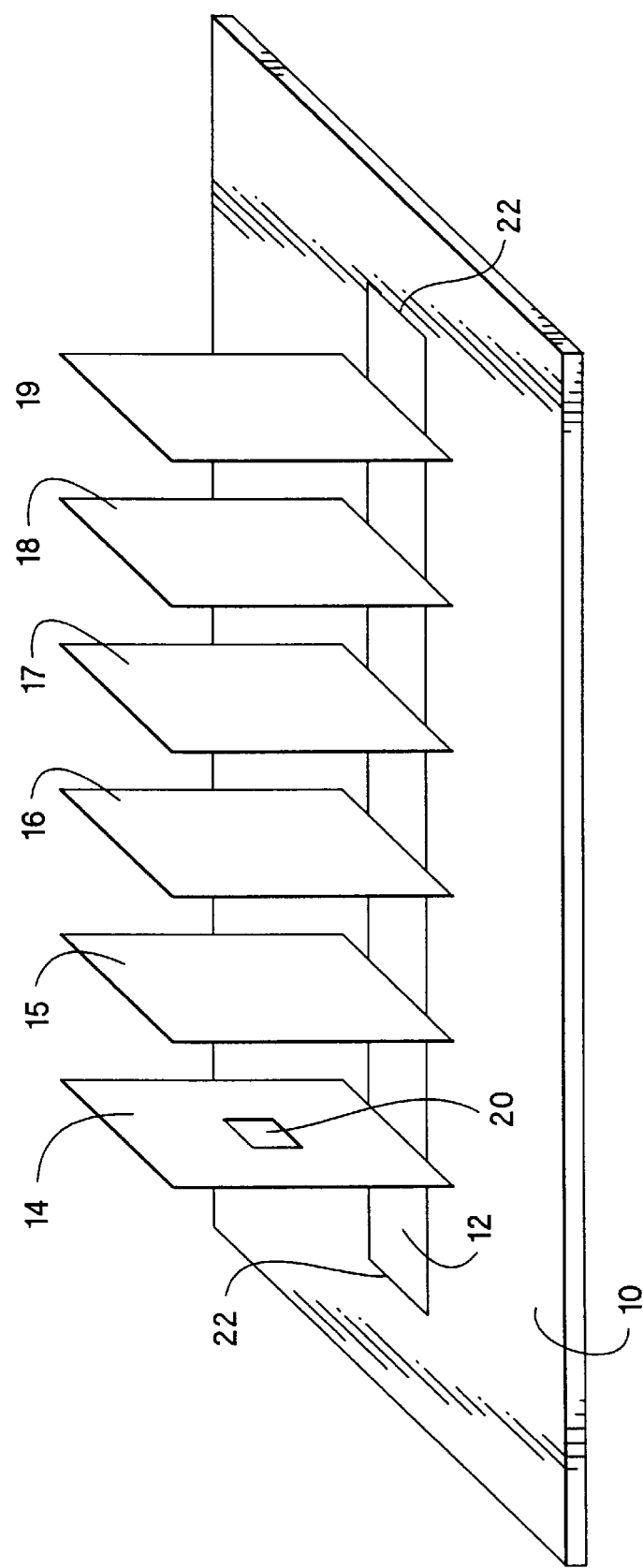
FIG. 1 shows a prior art computer interconnect backplane 10.

As shown in the drawings for purposes of illustration, the invention is embodied in a computer backplane interconnection bus which minimizes impedance mismatches. The computer backplane interconnection bus provides many input/output connections to the interconnection bus without introducing an impedance mismatch for each input/output interconnection.

Figure 4:
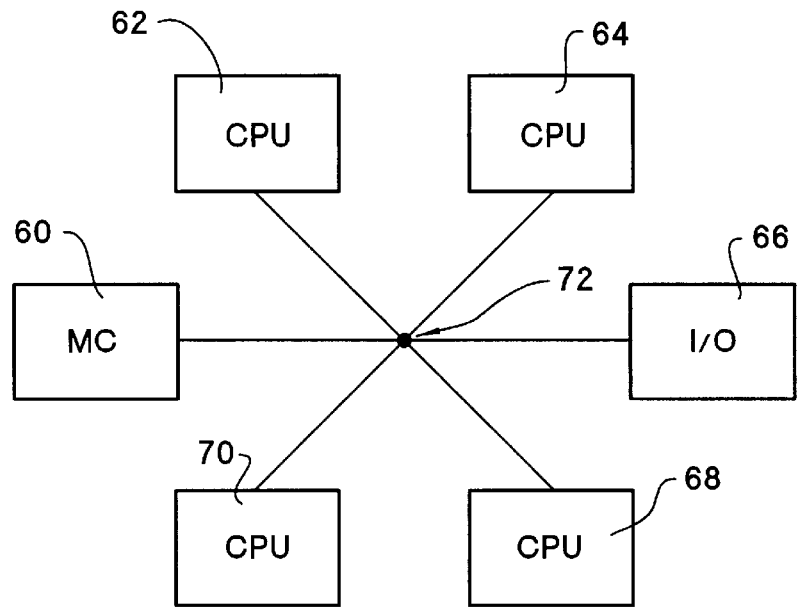
FIG. 4 shows an ideal star interconnect backplane bus topology.

FIG. 4 shows an ideal star configuration bus interconnection. This interconnection includes the length of the bus being minimized. Several devices 60, 62, 64, 66, 68, 70 are each connected through transmission lines having a predetermined characteristic impedance to a single connection point 72. Each individual device 60, 62, 64, 66, 68, 70 includes an input impedance which is substantially equal to the characteristic impedance of the transmission lines. The star interconnection topology provides an interconnection scheme in which a transitional edge of a voltage potential change generated at the output of any of the devices 60, 62, 64, 66, 68, 70 will only interact with an impedance mismatch a single time before being interacting with a matched impedance. Therefore, transients on the interconnection are damped quickly and minimal ringing of transitional edges occurs. The star interconnection topology provides a minimal number of impedance mismatches along the interconnection while allowing many devices to be connected.

Figure 5:
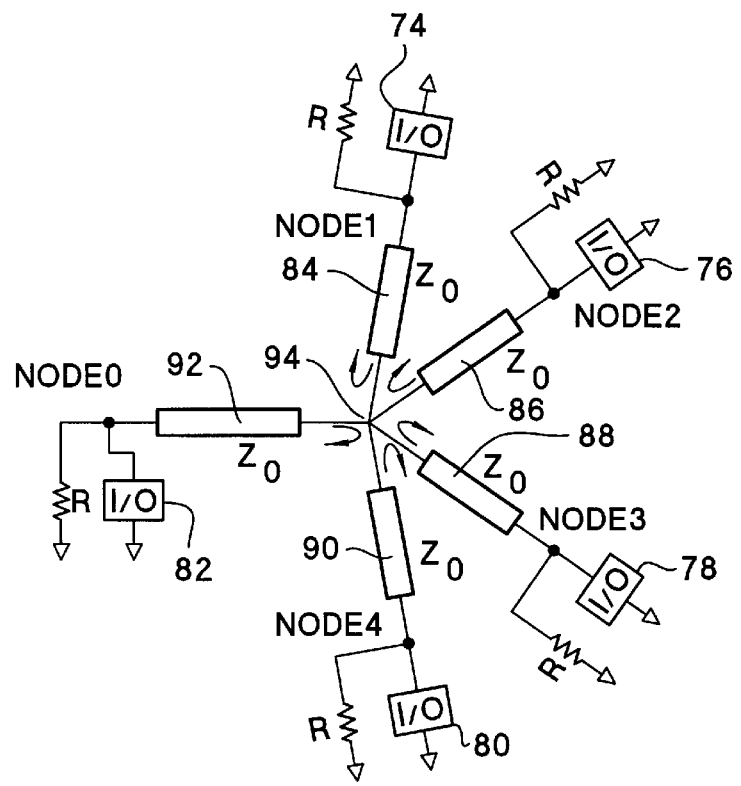
FIG. 5 is a circuit schematic that represents an ideal star interconnect backplane bus.

FIG. 5 shows a circuit schematic that represents a star configuration bus interconnection in which five I/O devices 74, 76, 78, 80, 82 are connected through component connection transmission lines 84, 86, 88, 90, 92 having a characteristic impedance of $Z_O$ to a single connection point 94. The I/O device 74, 76, 78, 80, 82 connections form nodes 0, 1, 2, 3, 4. The arrows on FIG. 5 depict where impedance mismatches within the interconnection bus are located. Each of the devices 74, 76, 78, 80, 82 have an input impedance R which is substantially equal to the characteristic impedance $Z_O$ of the transmission lines 84, 86, 88, 90, 92.

Figure 2:
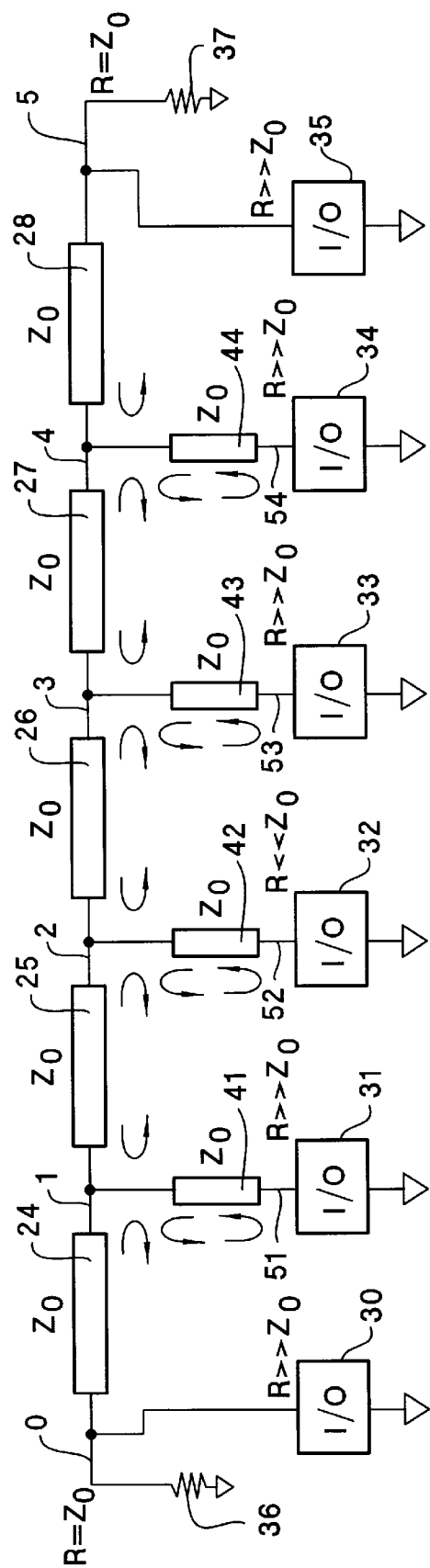
FIG. 2 is a circuit schematic that represents a typical prior art backplane bus with component connection transmission line sections connecting components to the bus and bus transmission lines connecting components to the bus

Comparison between the circuit schematic of the star interconnection bus of FIG. 5 and the circuit schematic of a typical backplane bus of FIG. 2 reveals that the star interconnection bus of FIG. 5 has much fewer arrows indicating mismatches. Further, a transient propagating from one of I/O devices of the star interconnection bus of FIG. 5 never encounters two mismatches in a row without encountering a matched impedance.

Figure 6A:
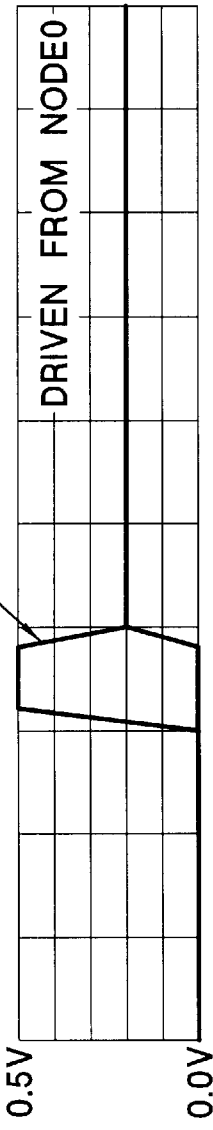
FIG. 6 shows the results of a transient simulation of the circuit schematic of FIG. 5.
Figure 6B:
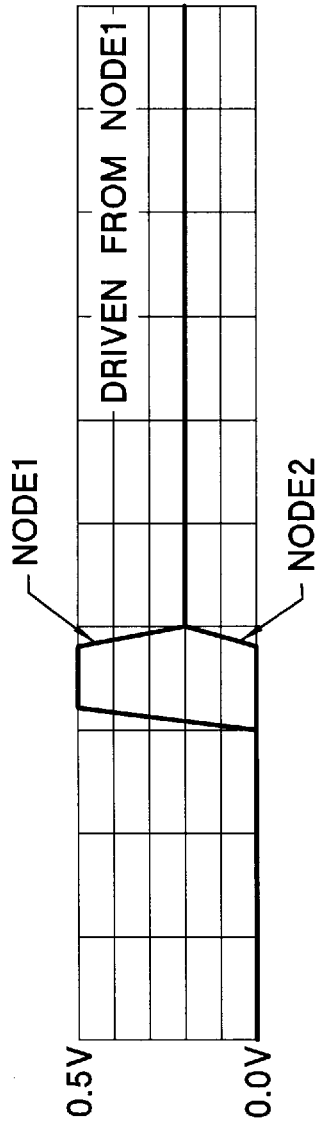
Figure 6C:
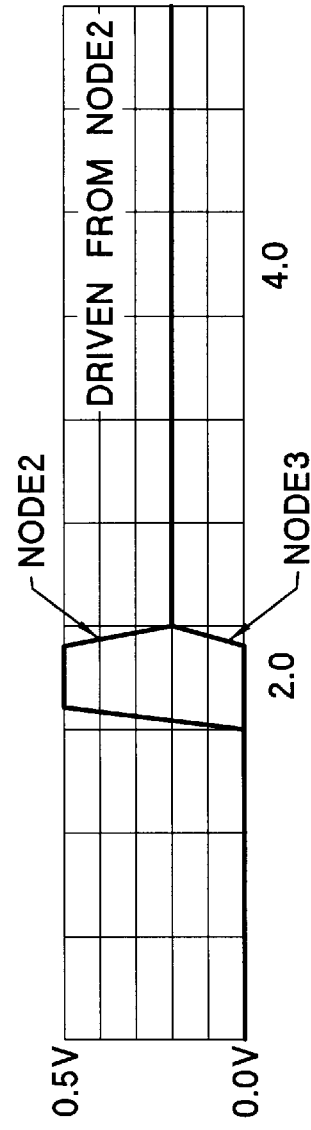

FIG. 6 shows the results of a transient simulation of the circuit schematic of FIG. 5 in which $Z_O$ is 50 ohms, the driver has an output impedance of 50 ohms and an open circuit output voltage of 1 volt, each component connection transmission line 84, 86, 88, 90, 92 is 200 picoseconds long, and the edge risetime is 100 picoseconds. The simulation results of FIG. 6 show that the star configuration of FIG. 5 introduces very little ringing when a pulse is generated by one of the devices 74, 76, 78, 80, 82 connected to the star configuration.

Traces 6A, 6B and 6C show time lines of the voltage levels received at node 0, node 1 and node 2 when the driver component is components 82, 74 and 76. Trace 6A shows the voltage level received at node 0 when the driver device is component 82. Trace 6B shows the voltage levels received at node 1 and node 2 when the driver device is component 74. Trace 6C shows the voltage levels at node 2 and node 3 when the driver device is component 76.

Figure 7:
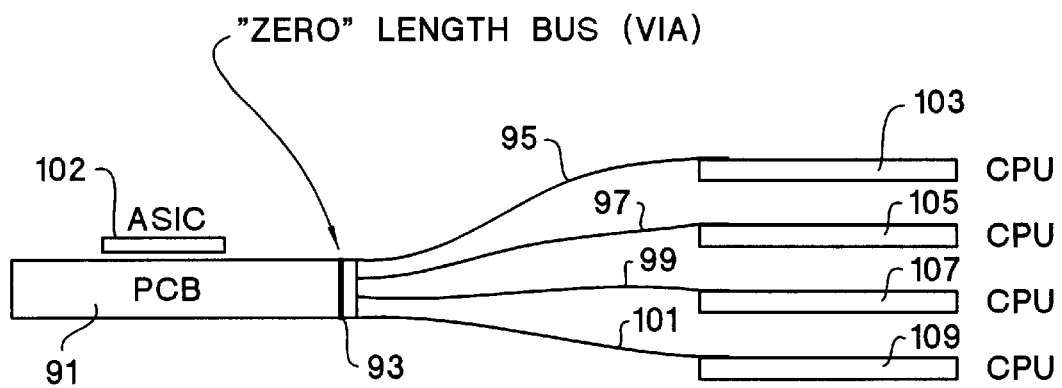
FIG. 7 shows an embodiment of the invention.

FIG. 7 shows an embodiment of the invention. This embodiment includes a master circuit board substrate 91. The master circuit board substrate 91 includes a via 93 which passes through several circuit board layers within the master circuit board substrate 91. At least one of the layers within the master circuit board substrate 91 includes a transmission line having a predetermined characteristic impedance which is electrically connected to the via 93. The transmission line is also connected to a controller located on the master circuit board substrate. The controller can be located within an application specific integrated circuit 102 (ASIC) as shown in FIG. 7.

This embodiment further includes several flexible printed circuits 95, 97, 99, 101. Each flexible printed circuit 95, 97, 99, 101 is connected to a separate one of the circuit board layers within the master circuit board substrate 91. The flexible printed circuits 95, 97, 99, 101 each include a transmission line having a predetermined characteristic impedance which is electrically connected to the via 93. Each flexible printed circuit 95, 97, 99, 101 is also attached to one of a plurality of interface circuit boards 103, 105, 107, 109. The interface circuit boards 103, 105, 107, 109 can each include a central processing unit (CPU) as shown in FIG. 7. Each interface circuit board 103, 105, 107, 109 includes an input impedance equal to the characteristic impedance of the transmission lines of the flexible printed circuits 95, 97, 99, 101.

The embodiment shown in FIG. 7 is a star configuration bus interconnection in which the via 93 is the interconnection point of star configuration bus interconnection. The shorter the length of the via 93, the closer the embodiment is to an ideal star configuration bus interconnection as shown in FIG. 4 and FIG. 5.

Figure 8:
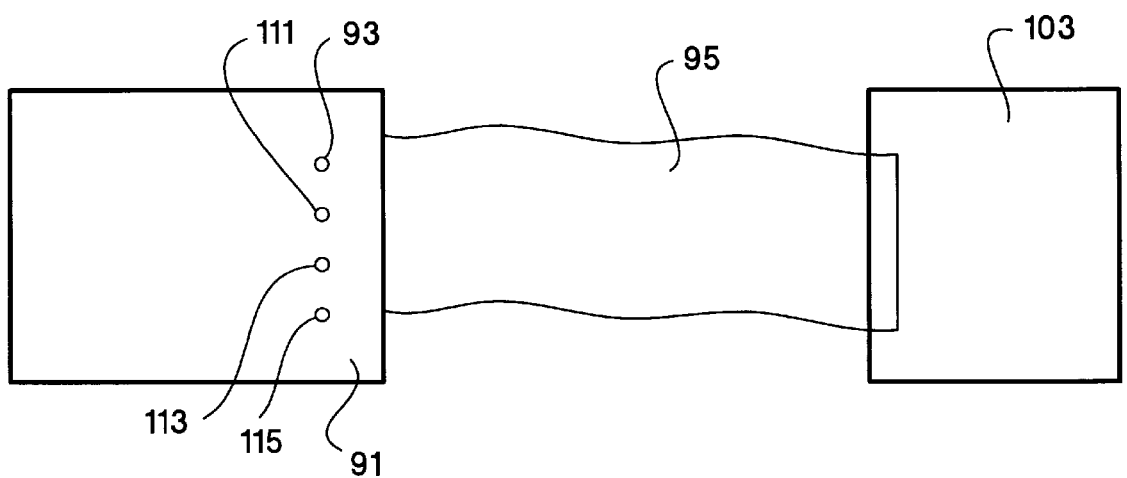
FIG. 8 shows a top-view of the embodiment shown in FIG. 7.
Figure 9:
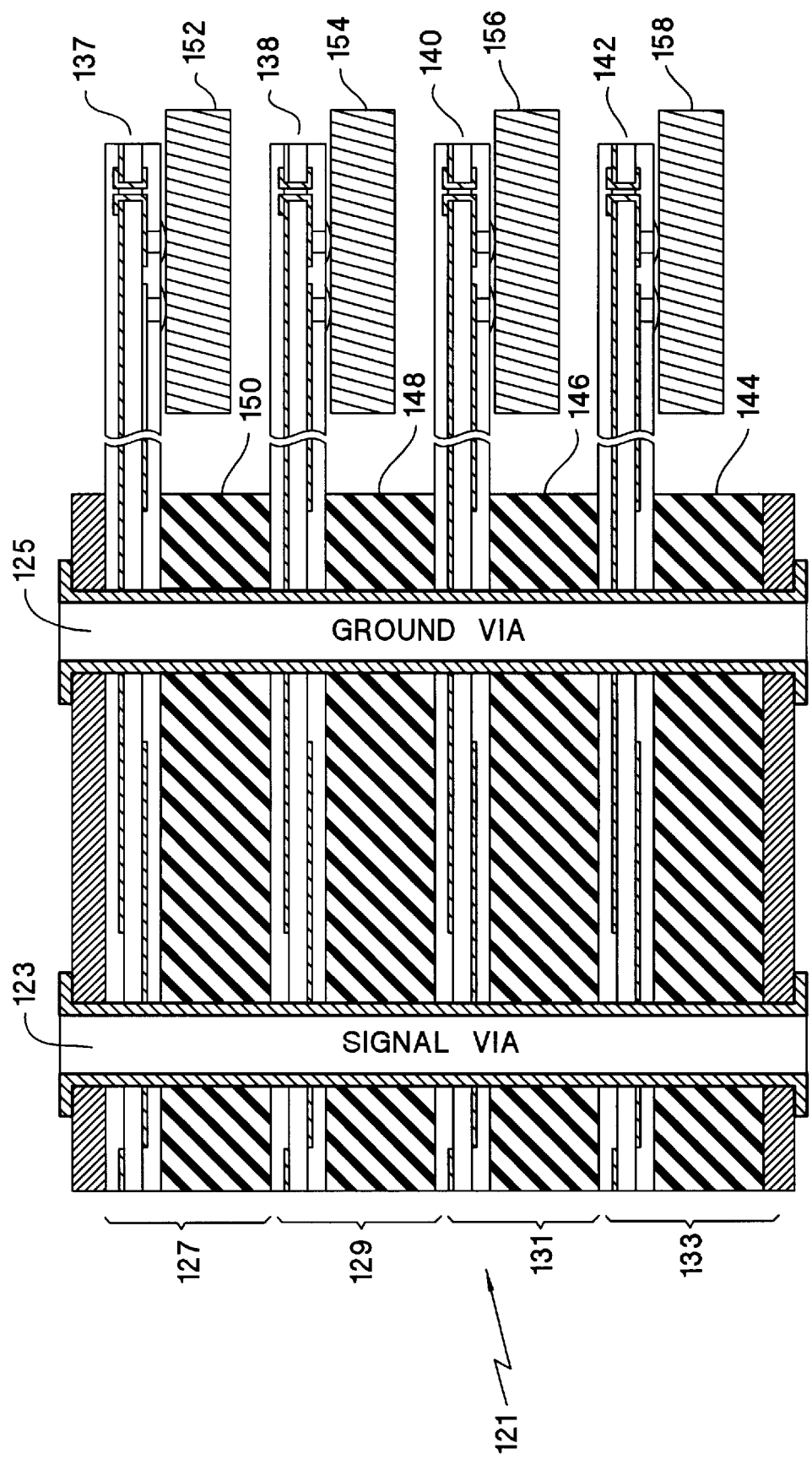
FIG. 9 shows another embodiment of the invention.

FIG. 8 shows a top-view of the embodiment shown in FIG. 7. The embodiment can include several vias 93, 111, 113, 115 in which each via forms the interconnection point of star configuration bus interconnection. Each via 93, 111, 113, 115 is either a ground via or a signal via. Each signal via is an interconnection point of a different star configuration bus interconnection FIG. 9 shows another embodiment of the invention. This embodiment includes a master circuit board substrate 121.

The master circuit board substrate 121 includes a signal via 123 and a ground via 125. The signal via 123 and the ground via 125 pass through a first layer 127, a second layer 129, a third layer 131 and a fourth layer 133 of the master circuit board substrate 121.

This embodiment further includes flexible circuit boards 137, 138, 140, 142. The master circuit board substrate 121 is formed by laminating end portions of the flexible circuit boards 137, 138, 140, 142 together. Each flexible circuit board 137, 138, 140, 142 forms a separate layer 127, 129, 131, 133 of the master circuit board substrate. Typically, a polyimide glue or resin is used as an adhesive to hold the laminated flexible circuit boards 137, 138, 140, 142 together. Holes are drilled through the laminated end portions where the vias 123, 125 are to be located. The holes are then metallized forming the vias 123, 125. The process of laminating flexible circuit boards together is well known in the art of circuit board fabrication.

Each of the flexible circuit boards 137, 138, 140, 142 include a signal conductor and a ground conductor which together form a transmission line having a predetermined characteristic impedance. The signal conductor and the ground conductor are generally formed from copper. The conductors must be thin enough that they remain flexible. The conductors are typically held in place with a polyimide glue or resin. The flexible circuit boards 137, 138, 140, 142 typically include a cover coat.

The flexible circuit boards 137, 138, 140, 142 are each electrically connected to an I/O device 152, 154, 156, 158. The interconnections between the flexible circuit boards 137, 138, 140, 142 and the I/O devices 152, 154, 156, 158 may be either separable or permanent. However, the interconnections should preserve the characteristic impedance of the transmission lines of the flexible circuit boards 137, 138, 140, 142. The I/O devices 152, 154, 156, 158 may include one or more electronic circuits. However, the I/O devices 152, 154, 156, 158 include an input impedance substantially equal to the characteristic impedance of the transmission lines of the flexible circuit boards 137, 138, 140, 142.

Figure 10:
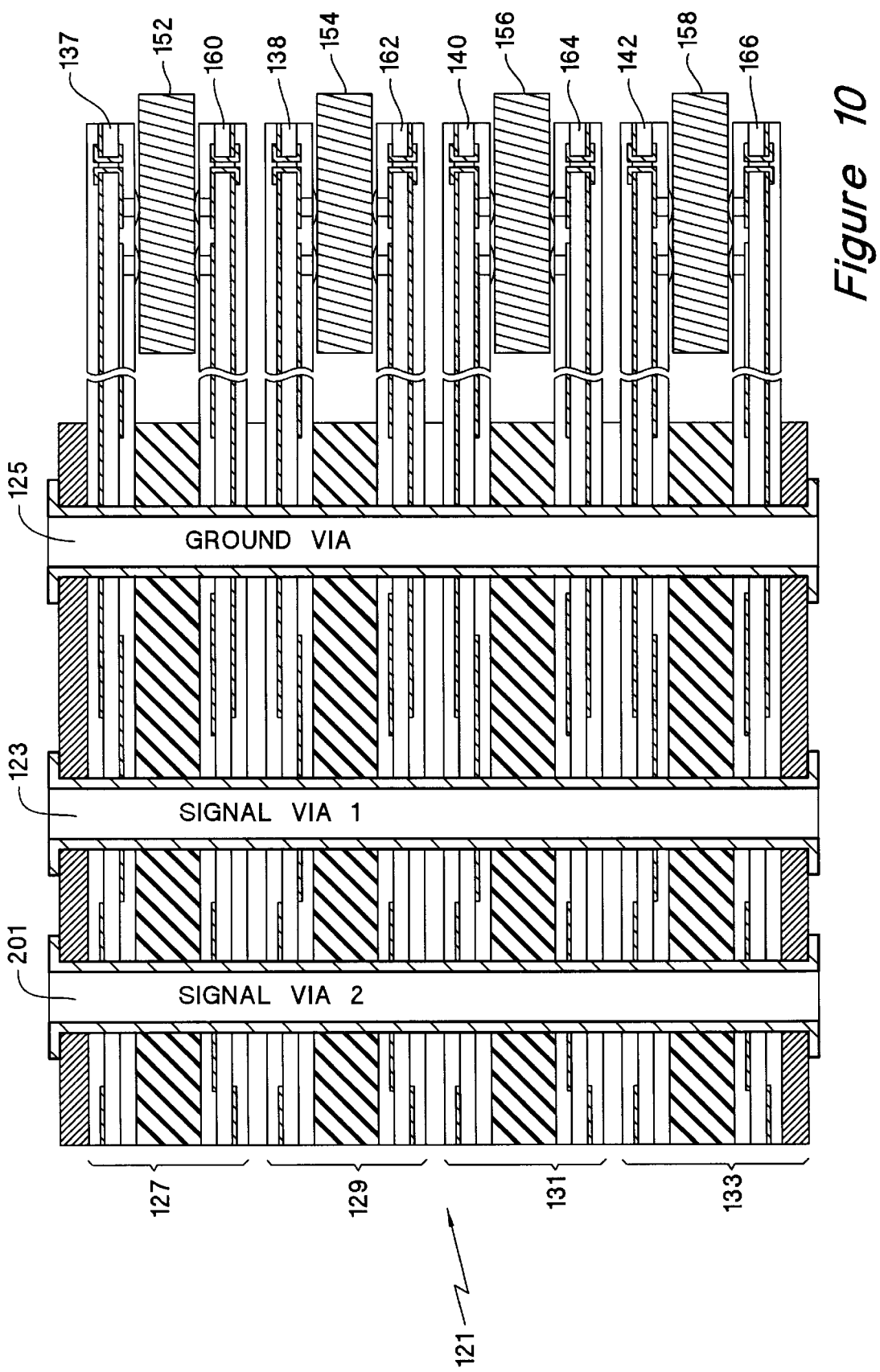
FIG. 10 shows another embodiment of the invention.

FIG. 10 shows another embodiment of the invention. This embodiment is similar to the embodiment shown in FIG. 9. However, this embodiment further includes a second set of flexible circuit boards 160, 162, 164, 166 which include transmission line interconnections. This embodiment also includes another signal via 201. The transmission line interconnections of the original flexible circuit boards 137, 138, 140, 142 and the transmission line interconnections of the second set of flexible circuit boards 160, 162, 164, 166 electrically interconnected the vias 123, 125, 201 and the I/O devices 152, 154, 156, 158. The addition of the second set of flexible circuit boards 160, 162, 164, 166 allows twice as many transmission line interconnections to be connected to each I/O device 152, 154, 156, 158. Alternately, the addition of the second set of flexible circuit boards 160, 162, 164, 166 allows the transmission lines connected to each I/O device 152, 154, 156, 158 to be twice as wide.

Figure 11:
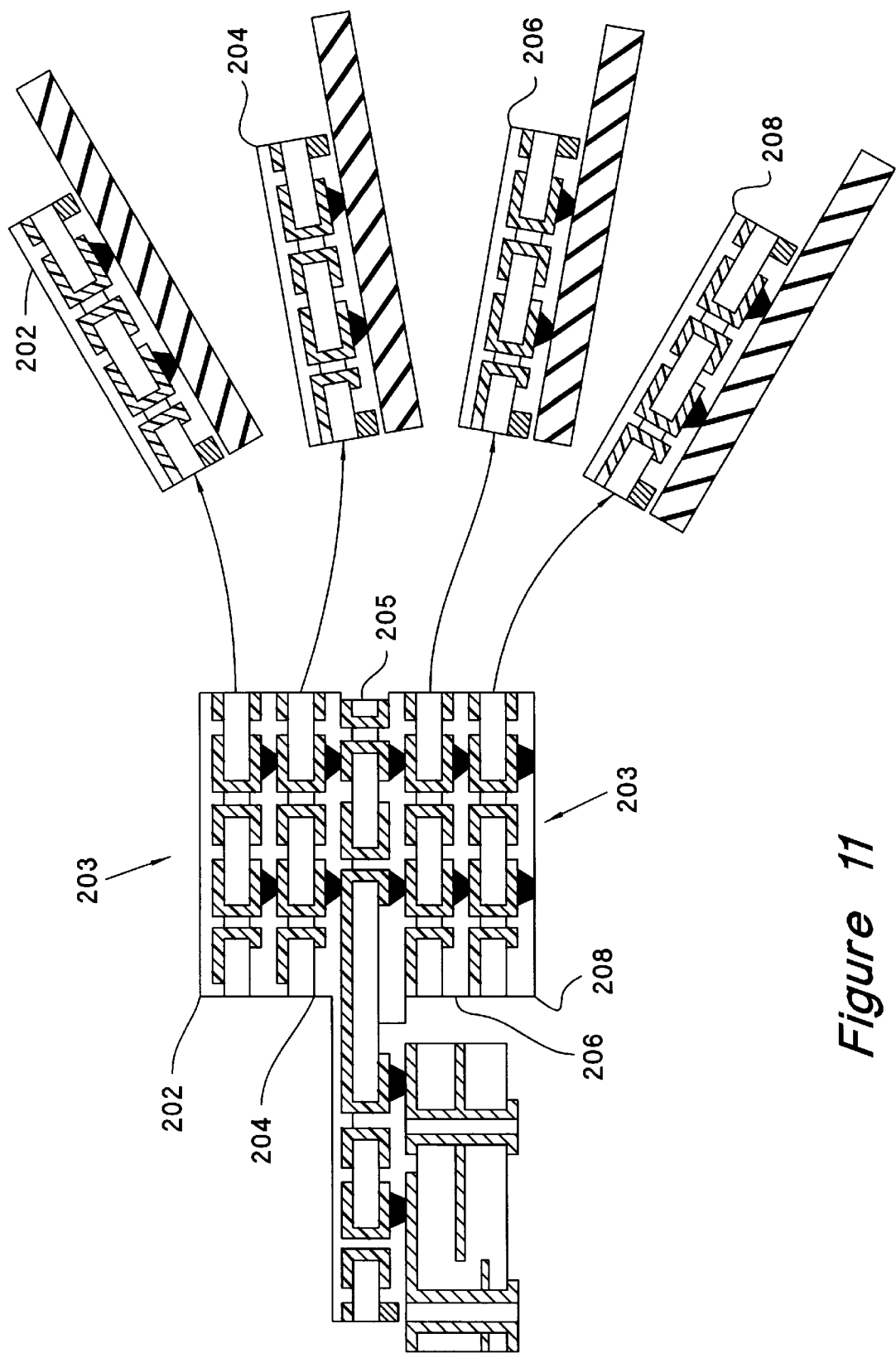
FIG. 11 shows another embodiment of the invention.

FIG. 11 shows another embodiment of the invention. This embodiment includes several flexible circuit boards 202, 204, 205, 206, 208. Signal and ground lines on the flexible circuit boards 202, 204, 205, 206, 208 form transmission lines which are interconnected at approximately a single interconnection point. The interconnection point is formed by pressing end portions 203 of the flexible circuit boards 202, 204, 205, 206, 208 together where interconnection pads and bumps reside on the flexible circuit boards 202, 204, 205, 206, 208. The end portions 203 of the flexible circuit boards 202, 204, 205, 206, 208 are laminated together so that a conductive bump of each flexible circuit board lines up with a conductive pad of an adjacent flexible circuit board. The embodiment shown in FIG. 11 includes the conductive bump and conductive pad interconnections being located at end portions 203 of the flexible circuit boards 202, 204, 206, 208.

During the lamination process of the end portions 203 of the flexible circuit boards 202, 204, 205, 206, 208, the conductive pads and conductive bumps form a metallurgical bond. The conductive pads and conductive bumps are held in intimate contact while a glue or resin between the flexible circuit boards 202, 204, 205, 206, 208 is cured during lamination.

A key feature of the embodiment shown in FIG. 11 is that the interconnections between the flexible circuit boards 202, 204, 205, 206, 208 are formed proximate to each other. The closer the interconnection are to each other, the closer the embodiment is to approximating an ideal star interconnection structure.

Figure 12:
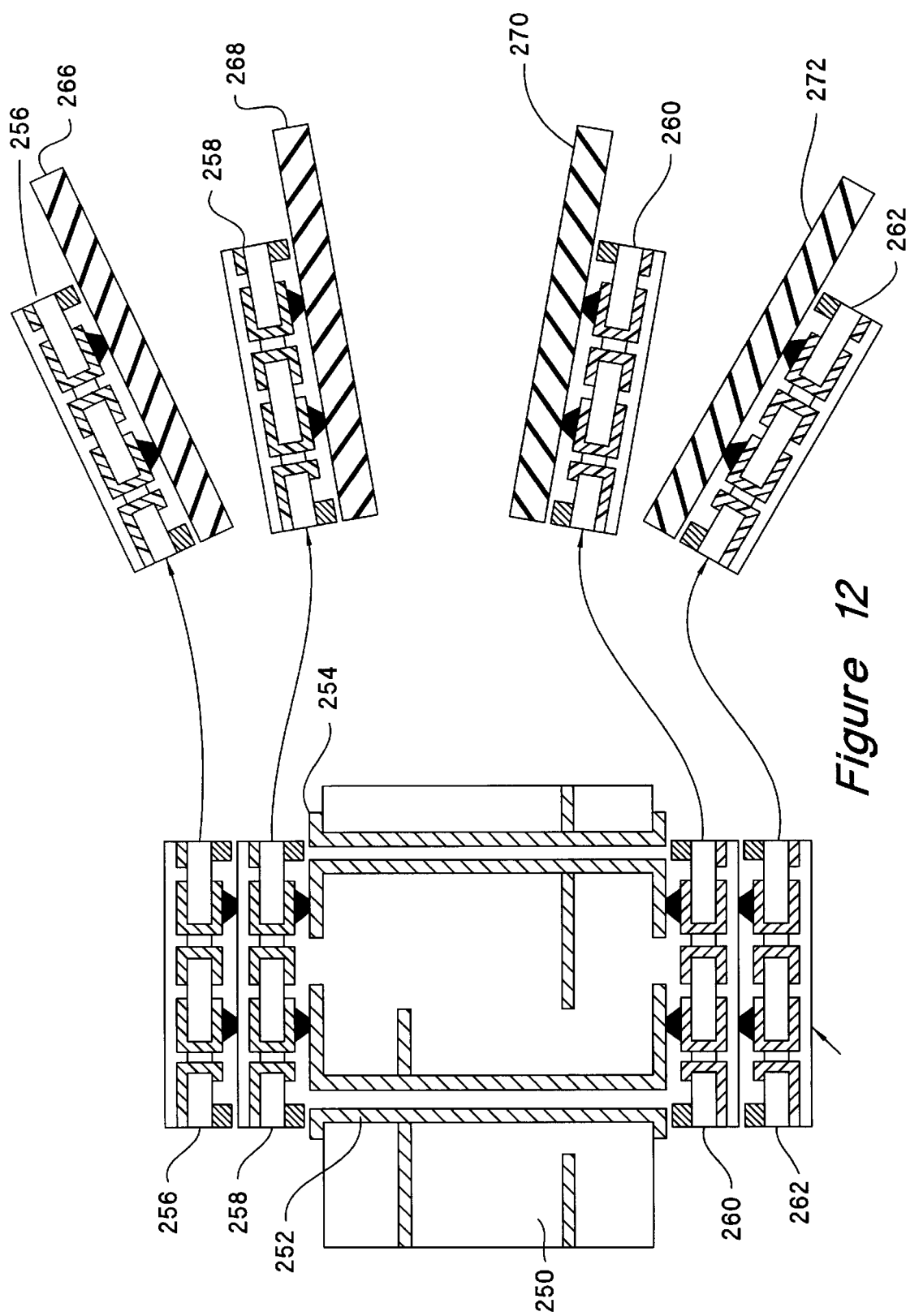
FIG. 12 shows another embodiment of the invention.

FIG. 12 shows another embodiment of the invention. This embodiment includes a fixed circuit board 250 which has a signal via 252 and a ground via 254. The embodiment further includes several flexible circuit boards 256, 258, 260, 262 which have transmission lines which are connected to both the signal via 252 and the ground via 254. The connections between the transmission lines of the flexible circuit boards 256, 258, 260, 262 and the vias 252, 254 are separable. That is, the connections are not permanent and can be disconnected. The disconnect ability of the flexible circuit boards 256, 258, 260, 262 aids in testing the functionality of flexible circuit boards 256, 258, 260, 262 and I/O devices 266, 268, 270, 272 connected to the flexible circuit boards 256, 258, 260, 262. Separable interconnections between flexible circuit boards can be formed by methods taught in U.S. Pat. No. 5,069,628.

Figure 13:
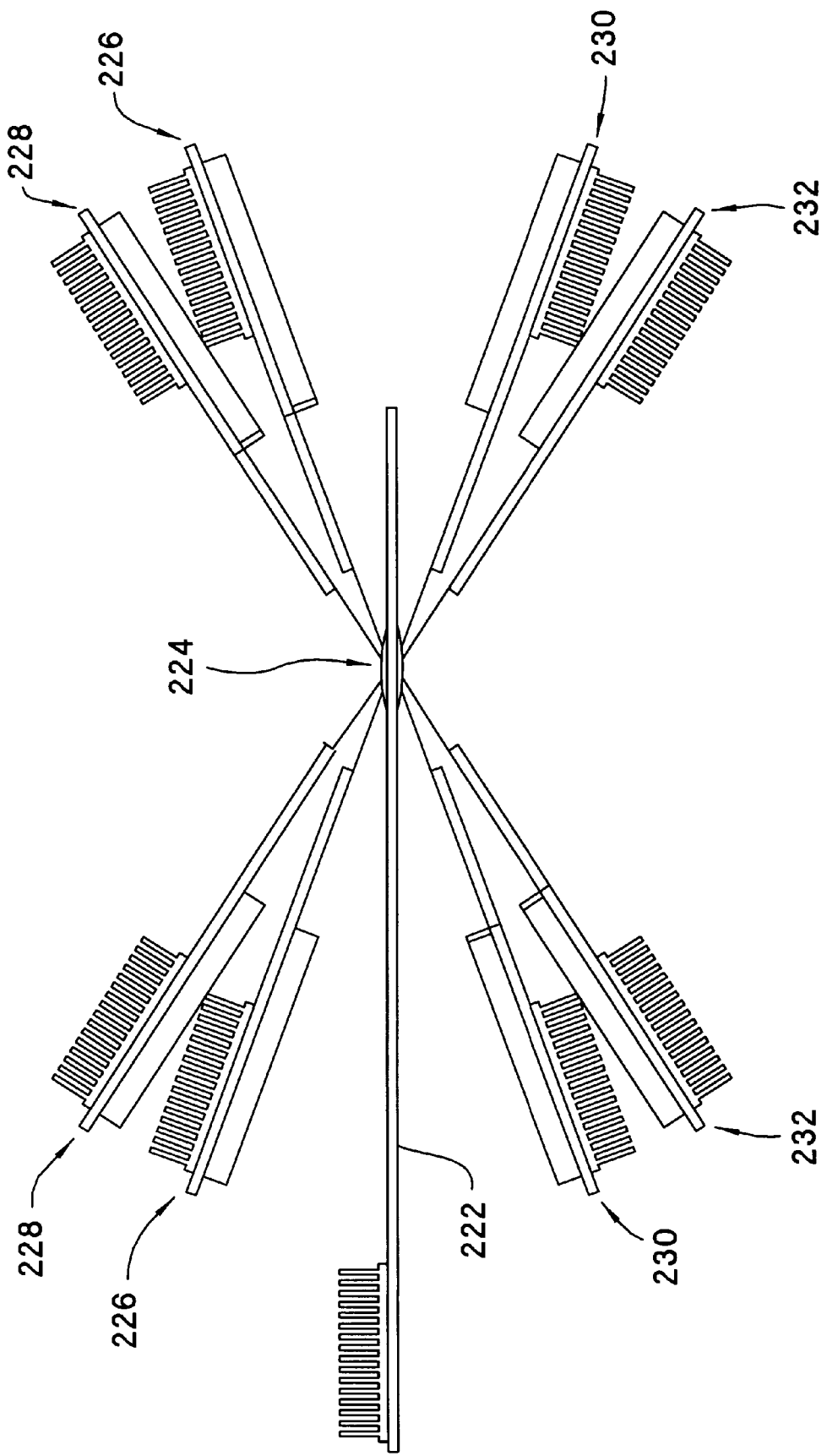
FIG. 13 shows another embodiment of the invention.

FIG. 13 shows another embodiment of the invention. This embodiment is an extension of the embodiments shown in FIGS. 9, 10, 11 and 12. That is, each of the embodiments shown in FIGS. 9, 10, 11 and 12 can be modified to include the features of the embodiment shown in FIG. 13. This embodiment includes flex circuit boards 226, 228, 230, 232 being interconnected to a mother board 222 at a center portion 224 of the flex circuit boards 226, 228, 230, 232 rather than at an end portion.

Although specific embodiments of the invention have been described and illustrated, the invention is not to be limited to the specific forms or arrangements of parts so described and illustrated. The invention is limited only by the claims.

What is claimed is:

1. An electrical interconnection structure comprising:
   a mother board substrate comprising a plurality of layers, at least one layer comprising a signal path having a characteristic impedance of $Z_O$ and at least one layer comprising conductive ground plane;
   a signal via passing through each layer of the mother board substrate, the signal via electrically connected to the signal path;
   a ground via passing through each layer of the mother board substrate, the ground via electrically connected to the conductive ground plane; and
   a plurality of flex circuits, each flex circuit comprising a flex signal path having a characteristic impedance of $Z_O$ and a flex ground plane, each flex circuit being received by a different layer of the mother board substrate, each flex signal path electrically connected to the signal via and each flex ground plane electrically connected to the ground via.

2. The electrical interconnection structure as recited in claim 1, further comprising a plurality of signal vias and a plurality of ground vias.

3. The electrical interconnection structure as recited in claim 1, further comprising a plurality of integrated chip modules, each integrated chip module being attached to a flex circuit and receiving the flex signal path and the flex ground plane.

4. The electrical interconnection structure as recited in claim 1, further comprising a plurality of integrated chip modules, each integrated chip module being attached to more than one flex circuit and receiving the flex signal path and the flex ground plane.

5. The electrical interconnection structure as recited in claim 3, wherein the integrated circuit chip modules comprise an input impedance substantially equal to the characteristic impedance $Z_O$.

6. The electrical interconnection structure as recited in claim 1, wherein the motherboard substrate comprises end portions of the flex circuits laminated together.

7. An electrical interconnection structure comprising:
   a mother board substrate comprising a plurality of layers, at least one layer comprising a signal path having a characteristic impedance of $Z_O$ and a conductive ground plane;
   a signal via passing through each layer of the mother board substrate, the signal via electrically connected to the signal path;
   a ground via passing through each layer of the mother board substrate, the ground via electrically connected to the conductive ground plane; and
   a plurality of flex circuits, each flex circuit comprising a flex signal path having a characteristic impedance of $Z_O$ and a flex ground path, the flex signal path being electrically connected to the signal via and the flex ground path being electrically connected to the ground via.

8. The electrical interconnection structure as recited in claim 7, wherein the electrical connections between the flex signal path and the signal via, and the flex ground path and the ground via are separable.

9. The electrical interconnection structure as recited in claim 7, further comprising a plurality of signal vias and a plurality of ground vias.

10. The electrical interconnection structure as recited in claim 7, further comprising a plurality of integrated chip modules, each integrated chip module being attached to a flex circuit and receiving the flex signal path and the flex ground plane.

11. The electrical interconnection structure as recited in claim 1, wherein each flex comprises an center portion, the circuit flex signal path being electrically connected to the signal via at the center portion.

12. The electrical interconnection structure as recited in claim 11, wherein the flex ground path is electrically connected to the ground via at the center portion.

* * * * *